United States Patent [19]

Chapman et al.

[11] 4,425,643

[45] Jan. 10, 1984

[54] MULTI-SPEED LOGIC ANALYZER

[75] Inventors: David D. Chapman, Portland; Gerd H. Hoeren, Lake Oswego; Steven R. Palmquist, Beaverton, all of Oreg.

[73] Assignee: Tektronix, Inc., Beaverton, Oreg.

[21] Appl. No.: 271,347

[22] Filed: Jun. 8, 1981

[51] Int. Cl.³ .................. G09G 1/08; G01R 31/28
[52] U.S. Cl. ..................... 371/20; 324/73 R; 340/721; 340/801; 340/802
[58] Field of Search ............. 371/16, 20, 29; 340/721, 731, 717, 801, 802; 324/73 R, 73 AT, 121 R; 364/521, 900

[56] References Cited

U.S. PATENT DOCUMENTS

| | | | |
|---|---|---|---|
| 3,522,597 | 8/1970 | Murphy | 340/722 |
| 4,139,903 | 2/1979 | Morrill, Jr. et al. | 364/900 |
| 4,204,114 | 5/1980 | Shoemaker et al. | 371/20 |
| 4,257,043 | 3/1981 | Tsuchiko | 340/721 |
| 4,308,615 | 12/1981 | Koegil et al. | 371/20 |
| 4,354,260 | 10/1982 | Planzo | 340/802 |
| 4,364,036 | 12/1982 | Shimizu | 340/121 R |

OTHER PUBLICATIONS

Farnbach, Logic State Analyzers-A New Instrument for Analyzing Sequential Digital Processes, IEEE Transactions on Instrumentation and Measurement, vol. IM-24, No. 4, Dec. 1975, pp. 353-356.

*Primary Examiner*—Charles E. Atkinson
*Attorney, Agent, or Firm*—George T. Noe

[57] ABSTRACT

A logic analyzer which can simultaneously measure one block of input data in detail and the same or another block of input data in rough form is disclosed. The logic analyzer comprises first and second sections each including a memory circuit to store the input data and a word recognizer to detect the desired trigger word from the input data. These first and second sections receive different clocks having different rates, and the second memory circuit stores the first clock applied to said first section for recognizing the time relationship of these clock signals. A counter counts the first clock in accordance with the outputs from the first and second word recognizers for recognizing the time relationship of the first and second trigger words.

8 Claims, 6 Drawing Figures

TIMING DIAGRAM

| POD | CH |
|---|---|
| A | 7 |
| A | 6 |
| A | 5 |
| A | 4 |
| A | 3 |
| A | 2 |
| A | 1 |
| A | 0 |
| B | 7 |
| B | 6 |
| B | 5 |
| B | 4 |
| B | 3 |
| B | 2 |
| B | 1 |
| B | 0 |

STATE TABLE DISPLAY

| SEQ | A BIN | B HEX |
|---|---|---|
| 526 | 01110001 | 01 |
| 527 |  | B3 |
| 528 |  | 47 |
| 529 |  | 9A |
| 530 | 10011010 | 32 |
| 531 |  | 6F |
| 532 |  | DC |
| 533 |  | 29 |
| 534 | 01101110 | 18 |
| 535 |  | 73 |
| 536 |  | A0 |
| 537 |  | 31 |
| 538 | 00101001 | E5 |
| 539 |  | 11 |
| 540 |  | 30 |
| 541 |  | 77 |

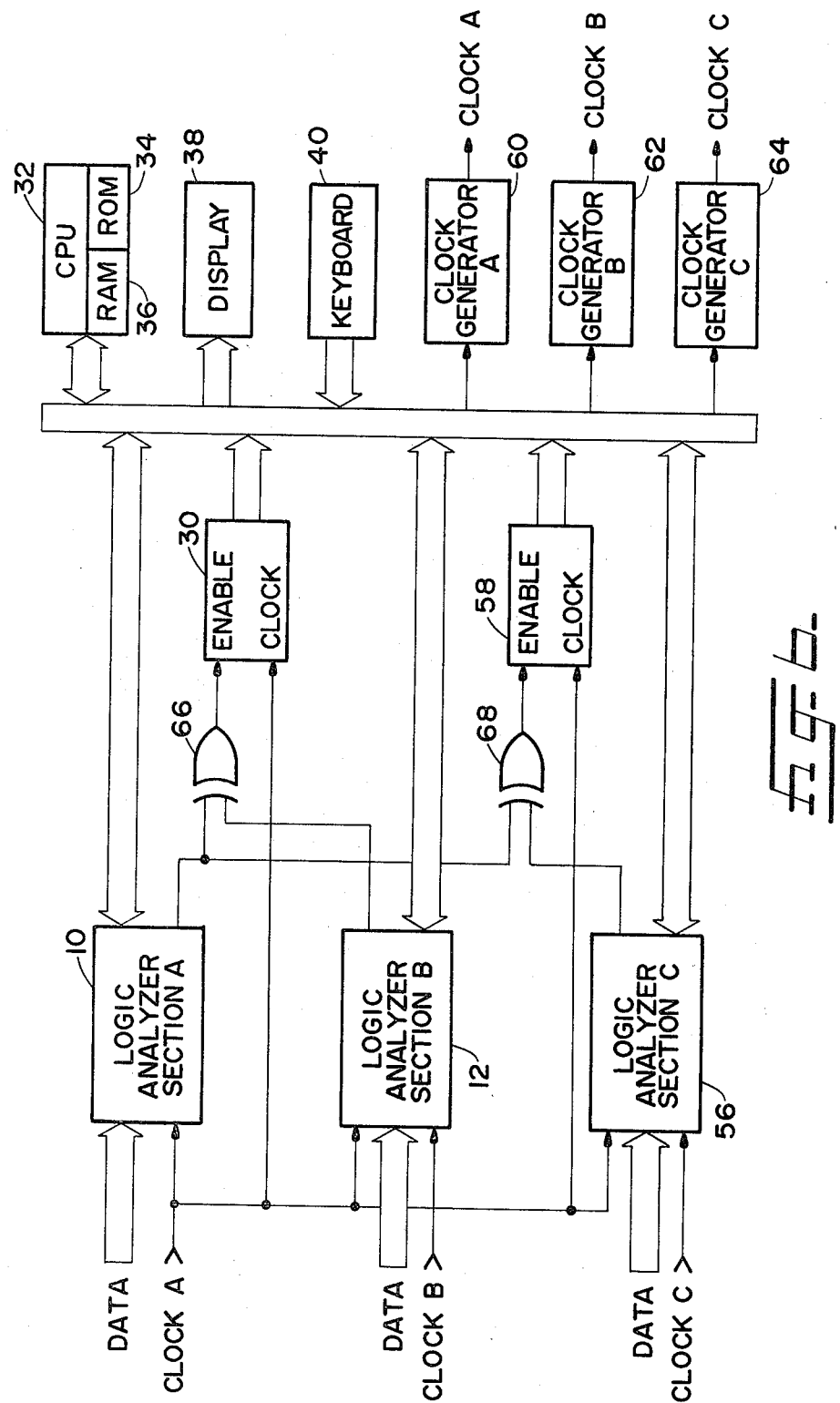

MULTI-SPEED LOGIC ANALYZER

CROSS REFERENCE TO RELATED APPLICATION

This application is related to co-pending application Ser. No. 271,345, filed June 8, 1981, entitled "Logic Analyzer for a Multi-Plexed Digital Bus."

BACKGROUND OF THE INVENTION

The present invention relates to a multi-speed logic analyzer which can measure one block of input logic data with a high frequency clock while measuring the same or another block of input logic data with a low frequency clock.

Logic measurement instruments are necessary to meet the need for calibrating or troubleshooting sophisticated digital electronic apparatus, particularly those that are microprocessor based. One such logic measurement instrument is a logic analyzer which stores input logic data in a memory and displays the stored data on a display device such as a cathode-ray tube. The logic analyzer is a very useful and versatile tool, because among other things, it can detect the desired word from the input data and measure the desired portions of the input data by reference to the desired word.

It is sometimes desirable to measure certain portions of one block of input data, such as control data, in detail using a high frequency clock while measuring the same or another block of input data, such as an address data, at a slower clock rate, because the operator can observe both the entire block of data as well as the portion of interest. However, conventional logic analyzers acquire the input data with the same clock frequency, and cannot acquire the input data (simultaneously) with different clock frequencies. Moreover, conventional logic analyzers cannot detect different trigger words for each block of input data, so that the operator cannot simultaneously observe different portions of the input data. Even if two or more logic analyzers are employed at the same time for measuring the input data with different clock frequencies and different trigger words for each logic analyzer, it is difficult to know the time relationships of the different clocks and different trigger words.

SUMMARY OF THE INVENTION

According to the present invention, one block of input logic data can be measured in detail by use of a high frequency clock while the same or another block of input logic data can be measured at a slower clock rate. The present invention includes at least two logic analyzer sections each comprising a memory circuit for storing the input data, a control circuit for controlling the write/read mode and memory address of the memory circuit, and a word recognizer/trigger circuit for detecting the desired trigger word from the input data and determining a trigger point. These logic analyzer sections receive different clock signals for storing the input data with the different clock frequencies, wherein the clock frequency of the first logic analyzer section is lower than that of the second logic analyzer section. The slow clock signal for the first logic analyzer section is stored in the second logic analyzer section with the input data for recognizing the time relationship between the slow and fast clocks.

The word recognizer/trigger circuit generates an output pulse when it detects the desired word from the input data. The present invention further includes a counter which counts the clock pulses between occurrences of output pulses from the word recognizer/trigger circuits in the first and second logic analyzer sections respectively upon detection of trigger words. The content of the counter is the time relationship information between the different trigger words. The stored data in the first and second logic analyzer sections are simultaneously displayed on the display device, and the content of the counter may be displayed.

It is therefore one object of the present invention to provide a novel multi-speed logic analyzer which can measure one block of input logic data in detail by using a high frequency clock while measuring the same or another block of input logic data in rough form at a slower rate.

It is another object to provide a novel logic analyzer comprising at least two logic analyzer sections each including a memory circuit and a word recognizer/trigger circuit, wherein each section stores input data with a different clock and a different trigger word.

It is a further object to provide a novel logic analyzer which can recognize the time relationship of the different clocks.

It is an additional object to provide a novel logic analyzer which can recognize the time relationship of the different trigger words.

The present invention is pointed out with particularity in the appended claims. Other objects and advantages of the present invention will become apparent to those having ordinary skill in the art when taken in conjunction with the accompanying drawings.

DRAWINGS

FIGS. 2 and 5 are time charts for explaining the operation of FIG. 1;

FIG. 6 is a block diagram of another embodiment according to the present invention.

DETAILED DESCRIPTION OF THE INVENTION

Figure 1:
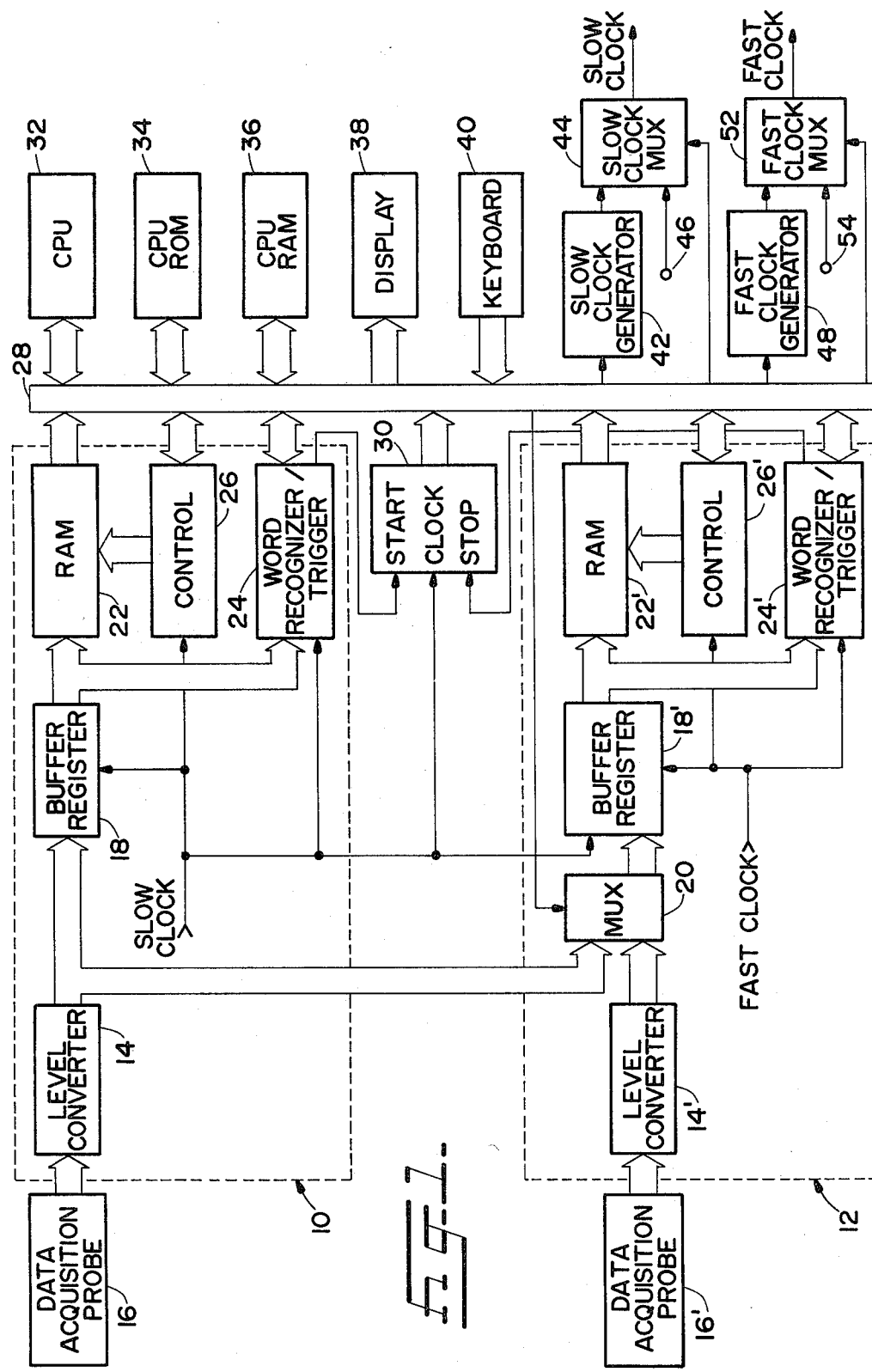
FIG. 1 is a block diagram of one embodiment according to the present invention.

Referring to FIG. 1, there is shown a block diagram of one embodiment according to the present invention. The present invention includes first and second logic analyzer sections 10 and 12, the construction of which are substantially the same. In first section 10, level converter 14 receives a first block of logic input data, such as an eight-bit address data of a microprocessor under test, from data acquisition probe 16 for converting the logic level of the input data into the predetermined logic level used in the logic analyzer of FIG. 1. The output from level converter 14 is applied to buffer register 18 and digital multiplexer 20 in second section 12. Buffer register 18 samples the input data in accordance with a slow clock and applies the sampled data to a memory circuit such as Random Access Memory (RAM) 22 and word recognizer/trigger circuit 24. Control circuit 26 includes a counter which receives the slow clock to determine the address of RAM 22, and transfers the address information to main bus 28 having data, address and control lines. Moreover, control circuit 26 controls the write/read mode of RAM 22 in accordance with an instruction from main bus 28. RAM 22 stores the data from buffer register 18 in the write mode, and applies the stored data to bus 28 in the read mode. Word recognizer/trigger circuit 24 receives the slow clock signal for synchronous operation and to operate a programmable counter contained therein. Circuit 24 detects the desired trigger word in the data from buffer register 18 in response to an instruction from bus 28, and applies the trigger word information output to bus 28. Since circuit 24 includes a programmable counter, it can select trigger positions such as pre-trigger (the data before the trigger word is stored), center trigger (the data before and after the trigger word is stored) and post-trigger (the data after the trigger word is stored). The trigger position instruction for setting the programmable counter is applied from bus 28, and another output (trigger point signal) for the trigger position information is applied to bus 28. Control circuit 26 stops the write mode of RAM 22 in accordance with the output from word recognizer/trigger circuit 24.

Second section 12 is similar to first section 10, so that like reference numbers have been employed to designate like blocks and only the differences will be discussed. Multiplexer 20 selects either first data detected by data acquisition probe 16 or second data (such as the eight-bit control data of the microprocessor under test) detected by data acquisition probe 16' in accordance with an instruction from bus 28. The selected data from multiplexer 20 and the slow clock signal are stored in RAM 22' through buffer register 18'. A fast clock having a frequency higher than the slow clock is applied to buffer register 18', word recognizer/trigger circuit 24' and control circuit 26'.

Counter 30 receives the output from word recognizer/trigger circuit 24 as a start signal, the slow clock as a clock signal and the output from word recognizer/trigger circuit 24' as a stop signal, wherein the outputs from circuits 24 and 24' are the trigger word or position information. Central Processing Unit (CPU) 32, which may suitably be a microprocessor, CPU Read Only Memory (ROM) 34 for firmware and CPU RAM 36 acting as a temporary memory are connected to main bus 28. Display device 38 is, for example, a raster-scan type cathode-ray tube display, and receives picture information from bus 28. Keyboard 40 applies instructions to bus 28 to set various conditions such as the trigger words, trigger points, clock frequencies, write-/read mode, display mode (timing diagram or state table display) or the like. Slow and fast clock generators 42 and 48 respectively generate the slow and fast clocks in accordance with instructions from bus 28. Slow clock multiplexer 44 selects the output of generator 42 or slow clock external terminal 46 in response to an instruction from bus 28. Similarly, fast clock multiplexer 52 selects the output of generator 48 or fast clock external terminal 54.

Figure 2:
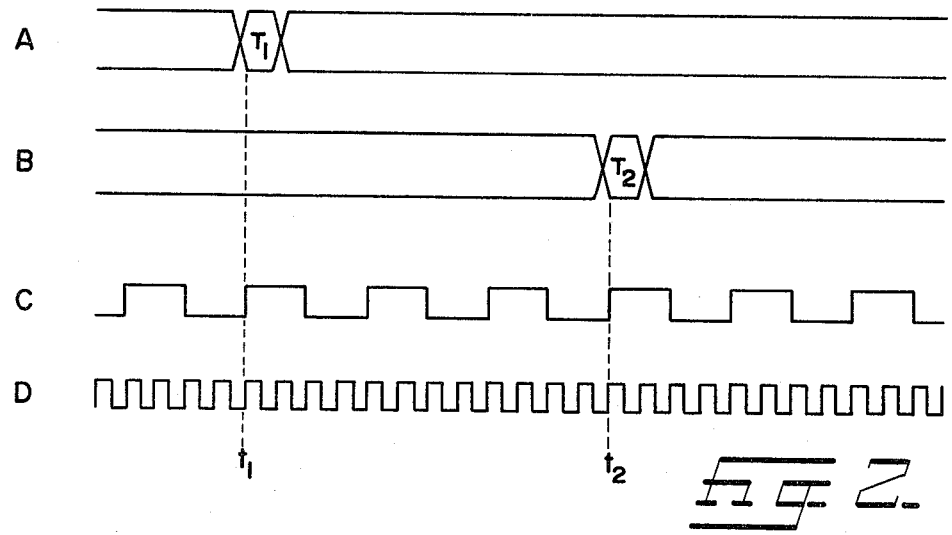

The operation of FIG. 1 will be described hereinafter by reference to FIGS. 2 through 5. The following conditions are assumed. Data acquisition probes 16 and 16' acquire data A and B respectively as shown in FIG. 2. Multiplexers 44 and 52 are set to select clock generators 42 and 48 which are set to generate slow clock C and fast clock D as shown in FIG. 2. Multiplexer 20 is set to select level converter 14'. First and second trigger words $T_1$ and $T_2$ are set for word recognized/trigger circuits 24 and 24', respectively and it is assumed that these trigger words $T_1$ and $T_2$ are included in the data A and B at times $t_1$ and $t_2$ respectively. Moreover, circuits 24 and 24' are set to the post-trigger mode in this example. The above settings are controlled by CPU 32 and keyboard 40 with the firmware in ROM 34, and stored in RAM 36.

When word recognizer/trigger circuit 24 detects the desired word $T_1$ in the data A at time $t_1$, circuit 24 generates the output to be applied to counter 30. Counter 30 and the counter of the word recognizer/trigger circuit 24 start to count the slow clock signal C in FIG. 2, and circuit 24 applies the output through bus 28 to control circuit 26 when the counter of circuit 24 counts the predetermined number as determined by the capacity of RAM 22. RAM 22 stores the data A in accordance with the address signal from control circuit 26, and stops storing data when control circuit 26 receives the output from word recognizer/trigger circuit 24. Therefore, RAM 22 stores the data A after the desired trigger word $T_1$.

When word recognizer/trigger circuit 24' detects the desired word $T_2$ in the data B at time $t_2$, circuit 24' applies the output to counter 30 which stops counting the slow clock C. The counter of word recognizer/trigger circuit 24' starts to count the fast clock D, and applies the output through bus 28 to control circuit 26' when the counter counts the predetermined number determined by the capacity of RAM 22'. RAM 22' stores the data B and slow clock C in accordance with the address signal from control circuit 26', and stops storing data B when control circuit 26' receives the output from word recognizer/trigger circuit 24'. Thus, RAM 22' stores the data B and slow clock C after the trigger word $T_2$.

Figure 3:
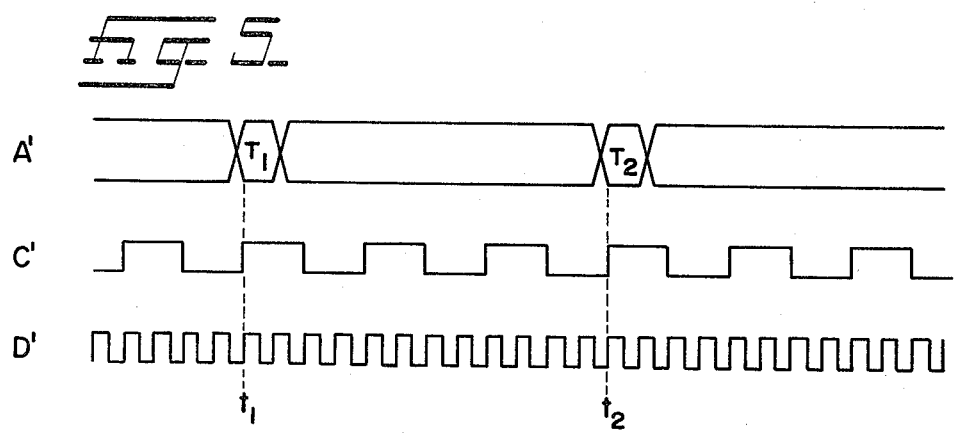
FIGS. 3 and 4 are displays according to the present invention for explaining the operation of FIG. 1.

When the timing diagram display is selected with keyboard 40, the display of display device 38 is shown in FIG. 3. This display is controlled by CPU 32 and the firmware in ROM 34. In the display, "POD CH" indicates kinds of the data acquisition probes and channels, i.e., "A" and "B" indicate respectively probes 16 and 16', and numbers associated therewith indicate the probe channels. For example, "A7" means the channel 7 of probe 16 and "B4" means the channel 4 of probe 16'. "S" indicates the slow trigger point of section 10, and "F" indicates the fast trigger point of section 12. The slow clock C stored in RAM 22' is used to determine the time relationship of the clocks of sections 10 and 12. According to the display of FIG. 3, the operator can simultaneously observe the data A in rough form and the data B in detail. This mode is very useful when the clock frequency of the data A is different from that of the data B. If the time relationship of the trigger words of sections 10 and 12 is necessary, the content of counter 30 may be displayed on display device 38 in accordance with the instruction from keyboard 40.

if the pre-trigger mode is selected with keyboard 40, word recognizer/trigger circuits 24 and 24' apply the store stop (trigger point) signals to control circuits 26 and 26' respectively when circuits 24 and 24' detect the trigger words. If the center trigger mode is selected, RAM's 22 and 22' store the input data before and after the trigger words under the control of word recognizer/trigger circuits 24 and 24' and control circuits 26 and 26'. The other operations of the pre-trigger and center trigger modes are the same as the post-trigger mode.

Figures 3, 4:
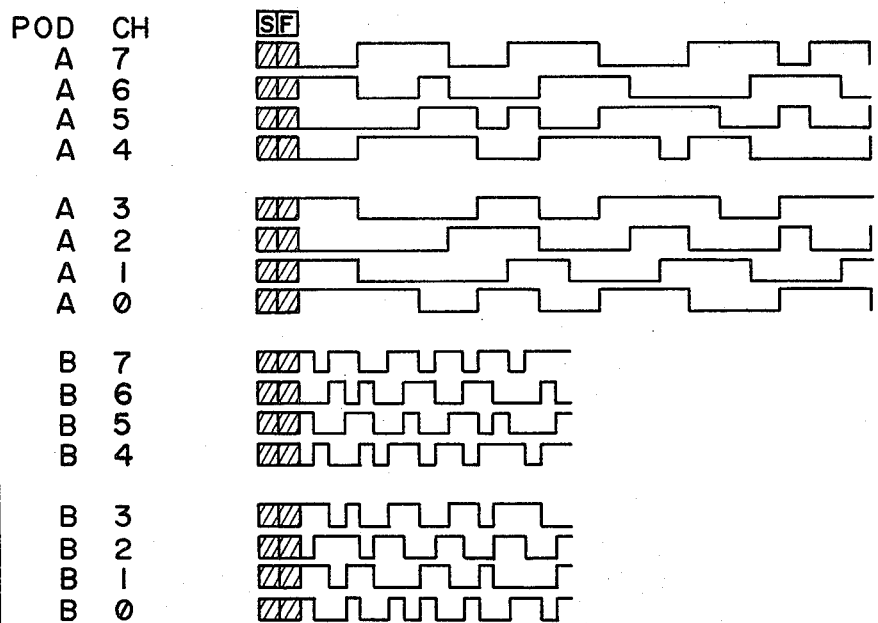

When a state table display mode is selected with keyboard 40, the display on display device 38 is as shown in FIG. 4. In the display, "SEQ" indicates the address of RAM 22', and "BIN" and "HEX" indicate binary and hexadecimal modes. The data stored in RAM's 22 and 22' are converted to the binary and hexadecimal numbers under the control of CPU 32 and the firmware in ROM 34. The stored data may be displayed in the octal mode. The logic analyzer of FIG. 1 can display the trigger words, the clock frequencies and other information, if necessary. The addresses of the display can be moved with keyboard 40.

When multiplexer 20 selects level converter 14 instead of converter 14', word recognizer/trigger circuit 24' detects the trigger word $T_2$ at time $t_2$ from the data A' acquired by probe 16 as shown in FIG. 5. The other operations are the same as the preceding cases already discussed, and the display on display device 38 is similar to FIG. 3 or 4; however, the displays "A" and "B" are the same data. It should be noted that the present invention can be used in a manner analogous to a dual sweep oscilloscope including normal and delayed sweep circuits.

FIG. 6 is a block diagram of a second embodiment according to the present invention. This embodiment includes three logic analyzer sections 10, 12, and 56, two counters 30 and 58, and three clock generators 60, 62, and 64. Logic analyzer section 10 stores input data and receives a clock signal A from generator 60. Sections 12 and 56 store the clock signal A and the same data applied to section 10, or other data, and receive clock signals B and C from generators B and C, respectively. The frequency of the clock A is lower than that of clock B which is lower than that of clock C. Sections 10, 12, and 56 apply "high" logic levels to exclusive OR gates 66 and 68 when the desired trigger words are detected. Since the outputs from exclusive OR gates 66 and 68 are applied to the enable terminals of counters 30 and 58, counters 30 and 58 start to count the clock A when section 10 detects the trigger word and stop counting when sections 12 and 56 detect the trigger words. Thus, the content of counter 30 is the time relationship information of the trigger words of sections 10 and 12, and the content of counter 58 is the time relationship information of the trigger words of sections 10 and 56. As the other operations are similar to the first embodiment shown in FIG. 1, no description will be made.

While we have shown and described herein the preferred embodiments of the present invention, it will be apparent to those skilled in the art that many changes and modifications may be made without departing from the present invention in its broader aspect. For example, counter 30 may count the fast clock or another standard clock. If the time relationship information of the trigger words of logic analyzer sections 12 and 56 is desired, CPU 32 may calculate it from the contents of counters 30 and 58 with the firmware in ROM 34. Word recognizer/trigger circuits 24 and 24' may apply the trigger point signals to counter 30.

We claim:

1. A multi-speed logic analyzer, comprising:
first and second logic analyzer sections each including a memory circuit to store input data and a word recognizer to detect a predetermined word from said input data for controlling said memory circuit; and
a counter to count a clock signal in accordance with the outputs from said word recognizers of said first and second logic analyzer sections, wherein said counter starts to count when said word recognizer of said first logic analyzer section detects a first predetermined word and stops counting when said word recognizer of said second logic analyzer section detects a second predetermined word; wherein clock signals for said first and second logic analyzer sections are different from each other.

2. A logic analyzer according to claim 1 wherein said second logic analyzer section further comprises means for receiving and storing said clock signal for said first logic analyzer section.

3. A logic analyzer according to claim 1 further comprising a first input channel for said first logic analyzer section and a second input channel for said second logic analyzer section, wherein said second logic analyzer section further includes a multiplexer the inputs of which are coupled to both said first and second input channels and the output of which is coupled to said memory circuit and word record recognizer of said second logic analyzer section to select the input data.

4. A logic analyzer according to claim 1 further comprising a central processing unit and firmware stored in a read-only memory coupled to said memory circuits, said word recognizers, and said counter for controlling said first and second logic analyzer sections.

5. A multi-speed logic analyzer, comprising:
first and second logic analyzer sections each including a memory circuit to store input data and a word recognizer to detect a predetermined word from said input data for controlling said memory circuit;
a counter to count a clock signal in accordance with the outputs from said word recognizers of said first and second logic analyzer sections; and
a display device for displaying the stored data in said memory circuits of said first and second logic analyzer sections, said display device also for displaying the content of said counter;
wherein clock signals for said first and second logic analyzer sections are different from each other.

6. A logic analyzer, comprising:
a first memory circuit to store input data under control of a first control circuit which receives a first clock signal;
a first word recognizer for detecting a first predetermined word from input data applied to said first memory circuit and controlling said first control circuit;
a second memory circuit to store said first clock signal and a selectable one of other input data and the same input data to be stored in said first memory circuit under control of a second control circuit which receives a second clock signal;
a second word recognizer for detecting a second predetermined word from the input data applied to said second memory circuit and controlling said second control circuit; and
a counter to count said first clock signal in accordance with the outputs from said first and second word recognizers, wherein said counter starts to count said first clock signal when said first word recognizer detects said first predetermined word and stops counting when said second word recognizer detects said second predetermined word;
wherein the frequency of said first clock signal is different from that of said second clock signal.

7. A logic analyzer, comprising:
means for generating first and second clock signals wherein the rate of said first clock signal is lower than the rate of said second clock signal;
a first logic analyzer section comprising a first input channel, a first memory device and a first word recognizer coupled to said first input channel, and a first memory control circuit coupled to said first memory device and being responsive to said first clock signal;

a second logic analyzer section comprising a second input channel, a second memory device and a second word recognizer coupled to said second input channel, and a second memory control circuit coupled to said second memory device and being responsive to said second clock signal, said second memory also receiving for storage therein said first clock signal, and a counter for counting said slow clock signal, said counter receiving a word recognition signal from said first word recognizer as a start signal, and receiving a word recognition signal from said second word recognizer as a stop signal.

8. A logic analyzer in accordance with claim 7 wherein said first input channel is also applied to said second logic analyzer section, and wherein said second logic analyzer section further comprises a multiplexer coupled to both said first and second input channels thereby to selectively apply input data to said second memory device and said second word recognizer.

* * * * *